(12) United States Patent
Morillon

(10) Patent No.: US 8,536,682 B2
(45) Date of Patent: Sep. 17, 2013

(54) LOW-VOLTAGE BIDIRECTIONAL PROTECTION DIODE

(75) Inventor: Benjamin Morillon, Tours (FR)

(73) Assignee: STMicroelectronics (Tours) SAS, Tours (FR)

( * ) Notice: Subject to any disclaimer, the term of this patent is extended or adjusted under 35 U.S.C. 154(b) by 60 days.

(21) Appl. No.: 12/946,992

(22) Filed: Nov. 16, 2010

(65) Prior Publication Data

US 2011/0121429 A1 May 26, 2011

(30) Foreign Application Priority Data

Nov. 24, 2009 (FR) ....................................... 09/58323

(51) Int. Cl.
*H01L 29/861* (2006.01)

(52) U.S. Cl.
USPC ............................................. 257/603; 361/56

(58) Field of Classification Search
USPC ............ 257/603, E29.335, 26, 513, E21.395, 257/E21.399; 438/380
See application file for complete search history.

(56) References Cited

U.S. PATENT DOCUMENTS

| | | | | |
|---|---|---|---|---|
| 3,484,308 A * | 12/1969 | Lesk | | 148/33.5 |
| 3,635,773 A * | 1/1972 | Thire | | 438/419 |
| 3,649,386 A * | 3/1972 | Murphy | | 257/626 |
| 3,677,838 A * | 7/1972 | De Brebisson | | 438/328 |
| 4,025,802 A * | 5/1977 | Inoue et al. | | 327/58 |
| 4,038,106 A * | 7/1977 | Kawamoto | | 438/380 |
| 4,045,252 A * | 8/1977 | Moutou | | 438/519 |
| 4,405,932 A * | 9/1983 | Ishii et al. | | 257/497 |
| 4,683,483 A * | 7/1987 | Burnham et al. | | 257/551 |
| 4,742,021 A * | 5/1988 | Burnham et al. | | 438/328 |
| 4,833,509 A * | 5/1989 | Hickox et al. | | 257/551 |
| 4,870,467 A * | 9/1989 | Boland et al. | | 257/603 |
| 4,999,683 A * | 3/1991 | Kiyomura et al. | | 257/606 |
| 6,459,133 B1 | 10/2002 | Brown et al. | | |
| 6,781,161 B1 * | 8/2004 | Turner et al. | | 257/109 |
| 6,919,587 B2 * | 7/2005 | Ballon et al. | | 257/107 |
| 7,238,582 B2 * | 7/2007 | Shimamoto et al. | | 438/332 |
| 7,384,854 B2 * | 6/2008 | Voldman | | 438/380 |
| 7,666,751 B2 * | 2/2010 | Marreiro et al. | | 438/380 |
| 7,812,367 B2 * | 10/2010 | Salih et al. | | 257/111 |
| 2002/0179924 A1 * | 12/2002 | Spitz et al. | | 257/106 |
| 2003/0205775 A1 * | 11/2003 | Einthoven et al. | | 257/497 |
| 2004/0000700 A1 * | 1/2004 | Romas et al. | | 257/603 |
| 2006/0014342 A1 * | 1/2006 | Khemka et al. | | 438/237 |
| 2006/0284283 A1 * | 12/2006 | Nakamura et al. | | 257/603 |
| 2007/0096261 A1 * | 5/2007 | Otake et al. | | 257/603 |
| 2008/0061377 A1 * | 3/2008 | Williams et al. | | 257/371 |
| 2008/0121988 A1 | 5/2008 | Mallikararjunaswamy et al. | | |
| 2010/0006889 A1 * | 1/2010 | Marreiro et al. | | 257/106 |

OTHER PUBLICATIONS

French Search Report dated Jul. 5, 2010 from corresponding French Application No. 09/58323.

* cited by examiner

*Primary Examiner* — Kyoung Lee
*Assistant Examiner* — Grant Withers
(74) *Attorney, Agent, or Firm* — Wolf, Greenfield & Sacks, P.C.

(57) ABSTRACT

A vertical bidirectional protection diode including, on a heavily-doped substrate of a first conductivity type, first, second, and third regions of the first, second, and first conductivity types, these regions all having a doping level greater than from 2 to $5 \times 10^{19}$ atoms/cm$^3$ and being laterally delimited by an insulated trench, each of these regions having a thickness smaller than 4 µm.

19 Claims, 2 Drawing Sheets

LOW-VOLTAGE BIDIRECTIONAL PROTECTION DIODE

CROSS REFERENCE TO RELATED APPLICATIONS

This application claims the priority benefit of French patent application number 09/58323, filed on Nov. 24, 2009, entitled "LOW-VOLTAGE BIDIRECTIONAL PROTECTION DIODE," which is hereby incorporated by reference to the maximum extent allowable by law.

BACKGROUND OF THE INVENTION

1. Field of the Invention

The present invention relates to a low-voltage bidirectional protection diode, that is, a diode having a breakdown voltage smaller than 10 volts, and preferably close to 6 volts, in both directions.

2. Discussion of the Related Art

Generally, the various techniques for constructing bidirectional protection diodes come against limitations when the breakdown voltage is desired to be decreased, and more specifically when a symmetrical diode, that is, a diode having substantially equal breakdown voltages close to from 6 to 10 volts, is to be obtained. Further, known bidirectional diodes are generally subject to a "snapback" phenomenon in at least one or the other of the two biasing directions, that is, even if the voltage at which the breakdown occurs is small, for example, close to 10 volts, there is a brief initial overvoltage, that is, the voltage across the diode rises up to a value greater than the reference value, for example, a value from 12 to 14 volts, before dropping back to the protection value close to 10 volts.

SUMMARY OF THE INVENTION

Thus, a general object of an embodiment of the present invention is to overcome at least some of the disadvantages of known bidirectional protection diodes.

Another object of an embodiment of the present invention is to provide a bidirectional protection diode having breakdown voltages close to 6 volts in both directions.

An object of an embodiment of the present invention is to provide a snapback-free bidirectional protection diode.

Another object of an embodiment of the present invention is to provide a bidirectional protection diode of small size.

To achieve at least some of these objects, as well as others, an embodiment of the present invention provides a vertical bidirectional protection diode comprising, on a heavily-doped substrate of a first conductivity type, first, second, and third regions of the first, second, and first conductivity types, these regions all having a doping level greater than from 2 to $5 \times 10^{19}$ atoms/cm$^3$ and being laterally delimited by an insulated trench, each of these regions having a thickness smaller than 4 µm.

According to an embodiment of the present invention, the second and third regions result from implantations in epitaxial layers having a thickness smaller than 4 µm.

According to an embodiment of the present invention, the different regions are respectively of type P, N, and P, the first region having a maximum doping level on the order of $5 \times 10^{19}$ atoms/cm$^3$, the second region having a maximum doping level on the order of $10^{20}$ atoms/cm$^3$, and the third region having a maximum doping level on the order of $5 \times 10^{19}$ atoms/cm$^3$, the tops of the doping curves of each of these regions being distant by less than 3 µm.

An embodiment of the present invention provides a method for manufacturing a vertical bidirectional protection diode comprising the steps of:

forming in a heavily-doped P-type substrate a first very heavily-doped P-type region;

forming a first epitaxial layer on the structure;

forming a second heavily-doped N-type region in the first epitaxial layer;

forming a second epitaxial layer on the structure;

forming a third heavily-doped P-type region in the second epitaxial layer;

surrounding the structure with an insulation trench crossing the three aforesaid regions.

According to an embodiment of the present invention, the last two steps are inverted.

According to an embodiment of the present invention, the various implantations are performed at doses ranging between 1 and $10 \times 10^{16}$ atoms/cm$^2$.

The foregoing objects, features, and advantages of the present invention will be discussed in detail in the following non-limiting description of specific embodiments in connection with the accompanying drawings.

DETAILED DESCRIPTION

As usual in the representation of microcomponents, the various cross-section views are not drawn to scale and should be considered as an illustration only.

Figure 1:
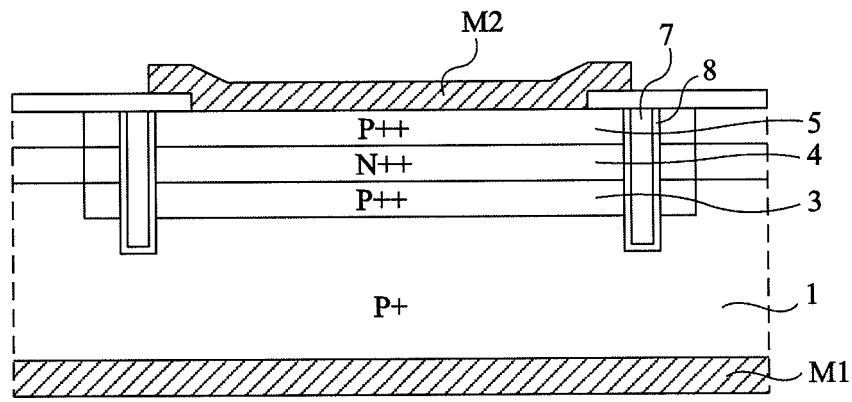
FIG. 1 is a cross-section view illustrating a protection diode according to an embodiment of the present invention.

FIG. 1 shows a diode of vertical type comprising, above a P$^+$-type substrate 1, very heavily doped successive layers 3, 4, and 5, respectively of type P$^{++}$, N$^{++}$, and P$^{++}$. "Very heavily doped" here means doping levels greater than or equal to $5 \times 10^{19}$ atoms/cm$^3$. The lower surface of substrate 1 is coated with a metallization M1. The assembly of layers 3, 4, and 5 is laterally delimited by a peripheral trench 7 with insulated edges 8 and upper layer 5 is coated with a metallization M2. Due to the very high doping levels of the N$^{++}$ base of the PNP transistor, the gain of this transistor is very low, which suppresses the snapback phenomenon. It should also be noted that the structure has a substantially symmetrical aspect. Further, the fact for the active structure to be surrounded with an insulated trench enables to avoid any edge and junction curvature phenomena which would occur at the component limits in other types of structures.

Figure 2:
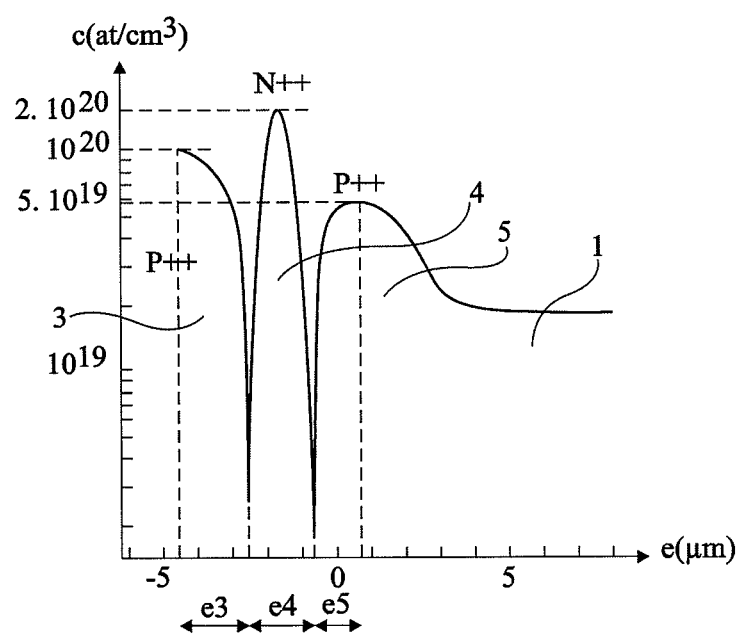
FIG. 2 shows doping levels of an example of the diode of FIG. 1.

FIG. 2 shows an example of doping levels selected for the structure of FIG. 1. FIG. 2 shows concentration c in atoms/cm$^3$ according to thickness e in micrometers. Thicknesses e3, e4, and e5 of regions 3, 4, and 5 have been indicated. It should be noted that thickness e4 of N$^{++}$ layer 4 preferably is on the order of 2 µm. In practice, it will range from 1.5 to 3 µm. Similarly, the distance between each of the junctions and the region of maximum doping of each of P$^{++}$ regions 3 and 5 is on the order of 2 µm, and preferably within a range from 1 to 3 µm.

Substrate 1 has been indicated as having a doping concentration ranging between 1 and $2 \times 10^{19}$ atoms/cm$^3$. Indeed, this is the maximum doping limit of substrates available for sale.

Of course, if substrates of higher doping level could be provided, P++ layer 3 could be unnecessary.

FIGS. 3A to 3F illustrate successive steps of an example of a method for manufacturing the bidirectional protection diode of FIG. 1.

Figure 3A:
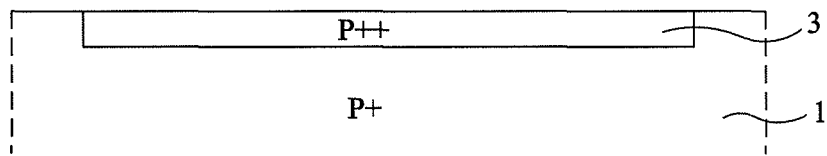
FIGS. 3A to 3F show successive steps of the manufacturing of a bidirectional protection diode according to an embodiment of the present invention.

As illustrated in FIG. 3A, it is started from as heavily-doped a P+ substrate 1 as possible, for example, with a doping level from 1 to $2 \times 10^{19}$ atoms/cm$^3$, which corresponds to a resistance of 5 mΩcm.

On the substrate, a P-type dopant, for example, boron, is implanted at a small depth at the maximum possible dose, for example, from 1 to $10 \times 10^{16}$ atoms/cm$^2$, to reach, at the end of the process, across a thickness of approximately 2 μm, a maximum doping level on the order of $5 \times 10^{19}$ atoms/cm$^3$. Preferably, area 3 is local, that is, it does not extend across the entire substrate surface, its implantation being limited by a mask.

Figure 3B:
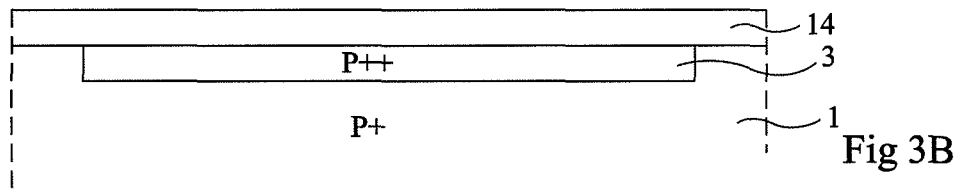

As illustrated in FIG. 3B, an epitaxy of a P- or N-type layer 14 having a doping lower than $5 \times 10^{18}$ atoms/cm$^3$ and a thickness from 1 to 3 μm, for example, 1.5 μm, has been performed.

Figure 3C:
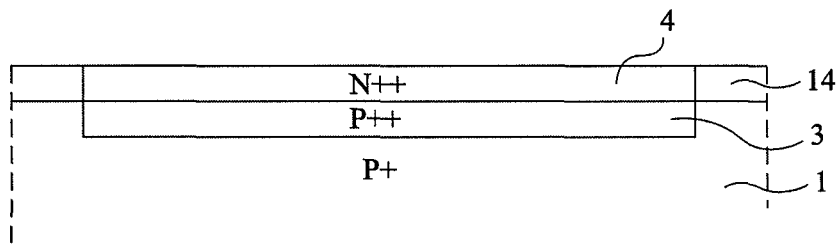

As illustrated in FIG. 3C, an N-type dopant, for example, arsenic at a dose from 1 to $10 \times 10^{16}$ atoms/cm$^2$, is locally implanted in epitaxial layer 14, above region 3, to reach, across the small thickness of the layer, a maximum concentration on the order of $2 \times 10^{20}$ atoms/cm$^3$.

Figure 3D:
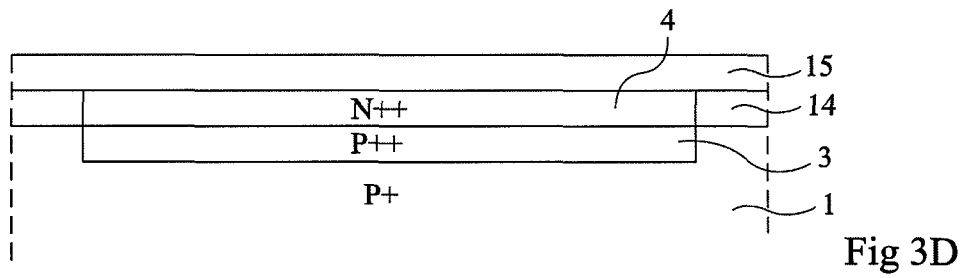

As illustrated in FIG. 3D, another epitaxy of a layer 15 having a doping smaller than $5 \times 10^{18}$ atoms/cm$^3$ and a thickness from 2 to 5 μm, for example, 3.5 μm, is performed.

Figure 3E:
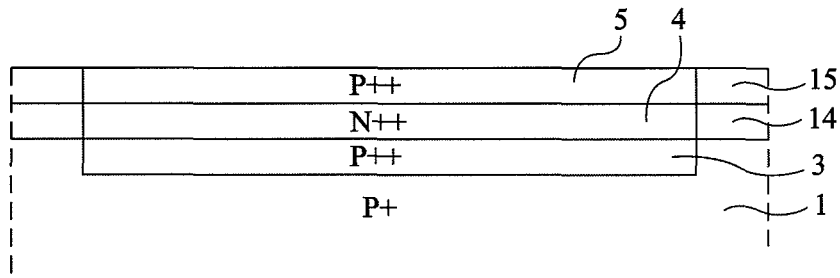

As illustrated in FIG. 3E, a heavy implantation of a P-type dopant, for example, boron at a dose from 1 to $10 \times 10^{16}$ atoms/cm$^2$, is then performed through a mask to reach in this layer a maximum doping level on the order of $10^{20}$ atoms/cm$^3$.

Figure 3F:
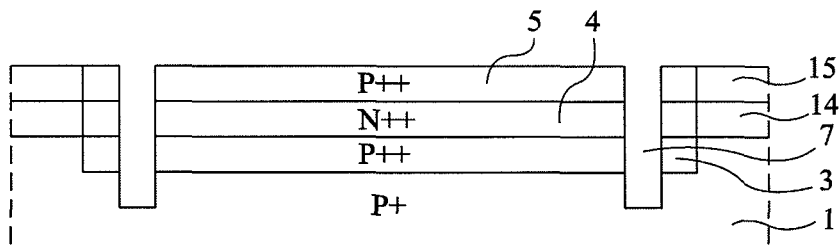

At the step illustrated in FIG. 3F, the structure is delimited by a peripheral trench 7.

The conventional steps of insulation of the trench walls, of filling of the trench, for example, with possibly oxidized polysilicon, of forming of front surface metallization M1, of grinding of the rear surface of the substrate to obtain a thickness approximately ranging from 50 to 200 μm for the structure, and of forming of rear surface metallization M2 to obtain the component illustrated in FIG. 1, are then carried out.

It should be noted that in the curve of FIG. 2, the origin of the thicknesses corresponds to the surface of substrate 1, negative thicknesses corresponding to the epitaxial layers.

The present invention is likely to have different variations. For example, the steps of FIGS. 3E and 3F may be inverted, that is, the insulation trenches may be formed before the having implantation for forming P++ region 5 is carried out.

An advantage of the manufacturing method of the present invention is that the implantations are performed at low power in layers of small thickness, which enables limiting the creation of defects and to limit anneal steps, which would disturb the structure.

It can be seen that this diode has a breakdown voltage on the order of 6 volts in both biasing directions between metallizations M1 and M2. The breakdown voltage may be adjusted to greater values, for example, up to 10 V, by modifying the ion implantation doses to form layers 3, 4, and 5. The performed tests show the absence of any snapback phenomenon.

Specific embodiments of the present invention have been described. Different variations and modifications will occur to those skilled in the art. In particular, as concerns the indicated numerical values and the types of dopants used.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A vertical bidirectional protection diode comprising, on a substrate of a first conductivity type, first, second, and third regions of the first, second, and first conductivity types, these regions all having a doping level greater than $2 \times 10^{19}$ atoms/cm$^3$ and being laterally delimited by an insulated trench, each of these regions having a thickness smaller than 4 μm, the substrate having a doping level greater than $1 \times 10^{19}$ atoms/cm$^3$.

2. The bidirectional diode of claim 1, wherein the second and third regions result from implantations in epitaxial layers having a thickness smaller than 4 μm.

3. The bidirectional diode of claim 1, wherein the different regions are respectively of type P, type N, and type P, the first region having a doping level on the order of $5 \times 10^{19}$ atoms/cm$^3$, the second region having a doping level on the order of $10^{20}$ atoms/cm$^3$, and the third region having a doping level on the order of $5 \times 10^{19}$ atoms/cm$^3$, tops of doping curves of each of these regions being distant by less than 3 μm.

4. An apparatus comprising:
a diode comprising:
a first semiconductor region, a second semiconductor region, and a third semiconductor region, the first semiconductor region and the third semiconductor region being of a first conductivity type and the second semiconductor region being of a second semiconductor type, a doping level of each of the first semiconductor region, the second semiconductor region, and the third semiconductor region being greater than $2 \times 10^{19}$ atoms/cm$^3$; and
an insulating region formed adjacent to the first semiconductor region and second semiconductor region.

5. The apparatus of claim 4, wherein the first semiconductor region is formed adjacent to the second semiconductor region and the second semiconductor region is formed adjacent to the third semiconductor region.

6. The apparatus of claim 4, wherein the third semiconductor region is a substrate having a doping level greater than $2 \times 10^{19}$ atoms/cm$^3$.

7. The apparatus of claim 6, further comprising:
a first epitaxial layer formed on the substrate, the first semiconductor region being formed in the first epitaxial layer; and
a second epitaxial layer formed on the substrate, the second semiconductor region being formed in the second epitaxial layer.

8. The apparatus of claim 4, wherein a doping level of each of the first semiconductor region and the second semiconductor region is greater than $5 \times 10^{19}$ atoms/cm$^3$.

9. The apparatus of claim 4, further comprising:
a substrate on which the first semiconductor region, the second semiconductor region, and the third semiconductor region are formed.

10. The apparatus of claim 9, wherein a doping level of each of the first semiconductor region, the second semiconductor region, and the third semiconductor region is greater than $5 \times 10^{19}$ atoms/cm$^3$.

11. The apparatus of claim 10, wherein a doping level of the second semiconductor region is greater than $1 \times 10^{20}$ atoms/cm$^3$.

12. The apparatus of claim 9, wherein the insulating region is formed adjacent to the first semiconductor region, the second semiconductor region, and the third semiconductor region.

13. The apparatus of claim 12, further comprising:
a second insulating region formed adjacent to the first semiconductor region, the second semiconductor region, and the third semiconductor region.

14. The apparatus of claim 12, wherein:
the first semiconductor region and the second semiconductor region are formed adjacent to one another in a first direction;
the second semiconductor region and the third semiconductor region are formed adjacent to one another in the first direction; and
the insulating region is formed adjacent to the first semiconductor region, the second semiconductor region, and the third semiconductor region in a second direction.

15. The apparatus of claim 14, further comprising:
a first metal region formed adjacent to the first semiconductor region in the first direction; and
a second metal region formed adjacent to the substrate in the first direction.

16. The apparatus of claim 4, wherein the diode is a bidirectional diode.

17. The apparatus of claim 4, wherein:
the diode is arranged to conduct current from a first terminal of the diode to a second terminal of the diode when the voltage difference between the first terminal and the second terminal exceeds a breakdown voltage of the diode, and
the breakdown voltage of the diode is below 10 volts.

18. The apparatus of claim 17, wherein:
the diode is arranged to conduct current from the second terminal of the diode to the first terminal of the diode when a voltage difference between the second terminal and the first terminal exceeds a second breakdown voltage of the diode, and
the second breakdown voltage of the diode is below 10 volts.

19. The apparatus of claim 18, wherein the breakdown voltage and the second breakdown voltage are below 7 volts.

* * * * *